United States Patent
Lindsey, Jr. et al.

(10) Patent No.: US 7,165,331 B1
(45) Date of Patent: Jan. 23, 2007

(54) APPARATUS AND METHOD FOR SCRIBING A SEMICONDUCTOR WAFER WHILE CONTROLLING SCRIBING FORCES

(75) Inventors: Paul C. Lindsey, Jr., Lafayette, CA (US); Bradley B. Engel, Milford, NH (US)

(73) Assignee: Micro Processing Technology, Inc., Lafayette, CA (US)

( * ) Notice: Subject to any disclaimer, the term of this patent is extended or adjusted under 35 U.S.C. 154(b) by 0 days.

(21) Appl. No.: 11/136,690

(22) Filed: May 24, 2005

(51) Int. Cl.
  *B43L 13/00* (2006.01)
(52) U.S. Cl. .......................... 33/18.1; 33/503; 33/549
(58) Field of Classification Search ................ 33/18.1, 33/26, 32.1, 501.02, 501.03, 503, 549
  See application file for complete search history.

(56) References Cited

U.S. PATENT DOCUMENTS

| | | | |
|---|---|---|---|
| 3,094,785 A | 6/1963 | Kulicke, Jr. | |
| 4,502,225 A | 3/1985 | Lin | |
| 4,825,555 A * | 5/1989 | Murayama et al. | 33/18.1 |
| 5,820,006 A | 10/1998 | Turner | |
| 6,460,258 B1 * | 10/2002 | Shimotoyodome | 33/18.1 |
| 6,536,121 B1 * | 3/2003 | Ishikawa et al. | 33/18.1 |
| 6,804,889 B1 * | 10/2004 | Ishikawa et al. | 33/18.1 |
| 6,826,840 B1 * | 12/2004 | Lindsey et al. | 33/18.1 |
| 2003/0084578 A1 * | 5/2003 | Ishikawa | 33/18.1 |
| 2003/0227494 A1 * | 12/2003 | Therond | 33/18.1 |
| 2005/0086821 A1 * | 4/2005 | Eichner et al. | 33/503 |
| 2006/0179670 A1 * | 8/2006 | Phipps et al. | 33/18.1 |

* cited by examiner

*Primary Examiner*—Yaritza Guadalupe-McCall
(74) *Attorney, Agent, or Firm*—Thomas R. Lampe

(57) ABSTRACT

A system for controlling scribing forces when scribing a semiconductor wafer includes supporting a scribe tool on an air bearing shaft. An encoder reads an encoder scale attached to the air bearing shaft and transport structure moves the tool support structure up or down to control the scribing force responsive to signals from the encoder.

12 Claims, 3 Drawing Sheets

APPARATUS AND METHOD FOR SCRIBING A SEMICONDUCTOR WAFER WHILE CONTROLLING SCRIBING FORCES

TECHNICAL FIELD

This invention relates to the manufacture of semiconductor devices and circuits and more particularly to a system incorporating an apparatus and a method for controlling scribing forces when scribing a semiconductor wafer.

BACKGROUND OF THE INVENTION

After devices or circuits are fabricated on a semiconductor wafer, the individual devices or circuits are usually separated from each other by sawing using a diamond-impregnated saw blade or by scribing the wafer with a scribe tool and fracturing the wafer along the scribed lines. In certain types of devices or semiconductor materials, scribing and cleaving is the preferred method of separating the individual units of the semiconductor wafer.

In order to scribe a semiconductor wafer, the scribe tool is placed on the surface of the wafer near the distal edge of the wafer and the wafer and scribe tool are moved laterally relative to each other for a distance equal to the entire width of the wafer, forming a scribe line. The scribe tool is raised from the surface of the wafer and the scribe tool and the wafer are indexed relative to each other in the direction perpendicular to the scribe line for a distance equal to the width of an individual device. The scribe tool is again placed on the surface of the wafer and the wafer and scribe tool are moved laterally relative to each other again for a distance equal to the entire width of the wafer forming a second scribe line. This process continues until the proximal edge of the wafer surface is reached. The wafer is then rotated 90 degrees and the process described above is repeated.

One of the most important process parameters in achieving a successful scribe line in the surface of the wafer, which in turn results in a successful cleave, is the scribe force applied to the scribe tool. If the force applied to the semiconductor wafer surface by the scribe tool is too low, the stress created in the semiconductor material under the scribe line is insufficient to allow a successful cleave during the breaking step. If the force applied to the semiconductor wafer surface by the scribe tool is too high, the surface of the semiconductor material will fracture and crack resulting in excessive chip out of material along the scribe line and possibly cracking that extends into the active regions of the semiconductor device.

Several different approaches have been employed in an effort to control the scribe force in different scribe apparatus. U.S. Pat. No. 3,094,785 discloses the approach of using changeable weights acting on a scribe arm that in turn applies force to the scribe tool. U.S. Pat. No. 4,502,225 discloses use of a series of levers and springs to apply the scribe force. Other known apparatus use air pressure acting on the scribe arm to control the scribe force. U.S. Pat. No. 5,820,006 describes a method of electronically controlling the scribe force by using a load cell mounted in a voice coil. Since load cells are analog devices, this approach will not work well, as the electrical noise from the motor drive system will interfere with the analog output from the load cell. U.S. Pat. No. 6,826,840 describes apparatus and a method to improve the control of force applied to the surface of a semiconductor wafer by the scribe tool using flexures and a linear encoder.

DISCLOSURE OF INVENTION

The present invention relates to a system which precisely and reliably controls the force exerted on a semiconductor wafer by a scribing tool and is operable to maintain that force at or very close to a predetermined force level applicable to the natures of the workpiece and tool employed. The system of the invention is characterized by its reliability and ease of use. The invention is particularly, but not exclusively, adapted for use with the transport gantry of the semiconductor wafer scribing system disclosed in afore-referenced U.S. Pat. No. 6,826,840.

The apparatus of the invention includes a wafer support for supporting a semiconductor wafer and a scribe tool. Scribe tool support structure supports the scribe tool.

Movable transport structure is operatively associated with the scribe tool support structure and the scribe tool supported thereby to selectively alternatively move the tool support structure and the scribe tool supported thereby toward or away from the wafer support and a semiconductor wafer supported thereon.

The scribe tool support structure includes relatively slidably movable first and second structural components, the scribe tool being attached to the first structural component and movable therewith relative to the second structural component responsive to force exerted by the scribe tool on the semiconductor wafer after engagement therebetween.

The transport structure is movable toward the semiconductor wafer when the force is less than a predetermined force and movable away from the semiconductor wafer when the force is greater than the predetermined force.

The apparatus additionally comprises an encoder connected to the second structural component for sensing the displacement of the first component and the scribe tool relative to the second structural component, a computer receiving signals from the encoder, and a motor for moving the movable transport structure alternatively toward or away from the semiconductor wafer controlled by signals from the computer.

According to the method of the invention, a semiconductor wafer is supported on a wafer support.

The method further includes utilizing scribe tool support structure having relatively slidably movable first and second structural components to support a scribe tool attached to the first structural component over the semiconductor wafer.

Movable transport structure is employed to move the scribe tool support structure and the scribe tool toward the semiconductor wafer to bring the scribe tool into engagement with the semiconductor wafer.

After the step of bringing the scribe tool into engagement with the semiconductor wafer, the transport structure is employed to cause the scribe tool to exert a force on the semiconductor wafer and cause relative slidable movement between the first and second structural components. The transport structure is moved toward the semiconductor wafer when the force is less than a predetermined force and moved away from the semiconductor wafer when the force is greater than the predetermined force.

Other features, advantages and objects of the present invention will become apparent with reference to the following description and accompanying drawings.

MODE FOR CARRYING OUT THE INVENTION

Figure 1:
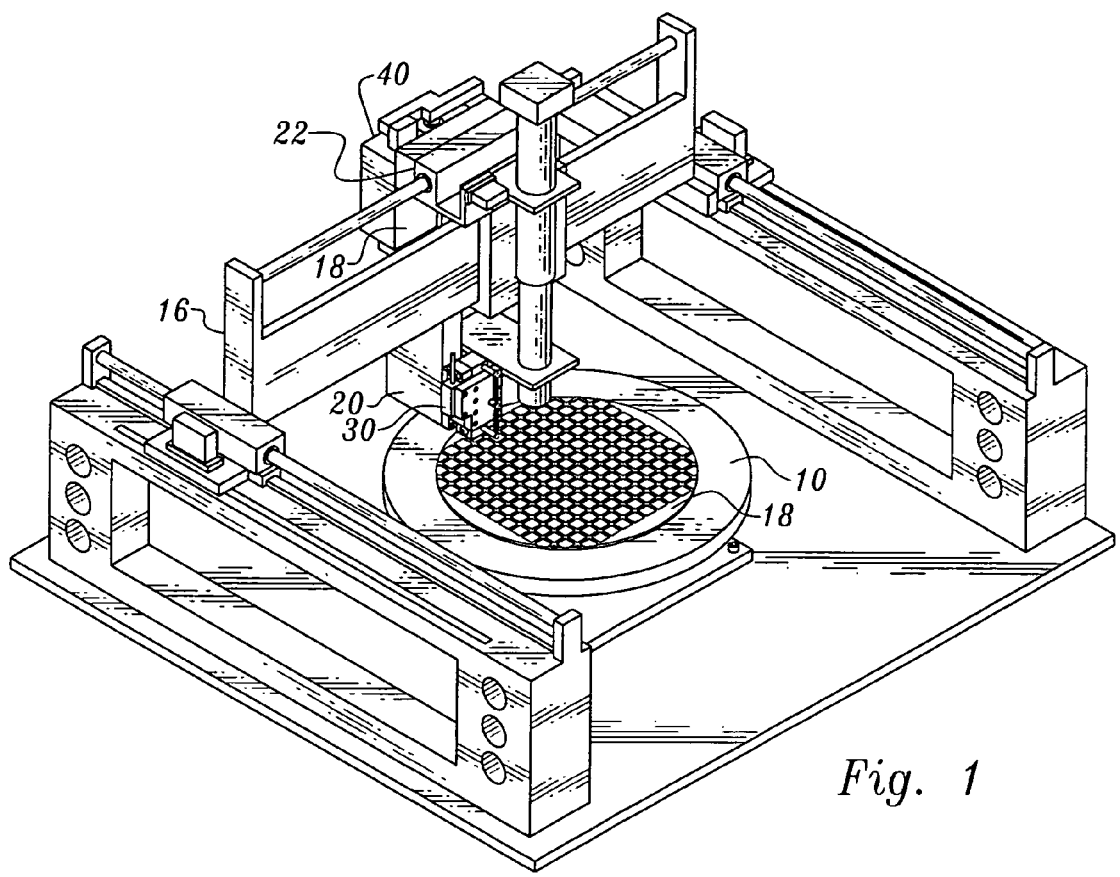
FIG. 1 is a frontal, perspective view of apparatus constructed in accordance with the teachings of the present invention.
Figure 2:
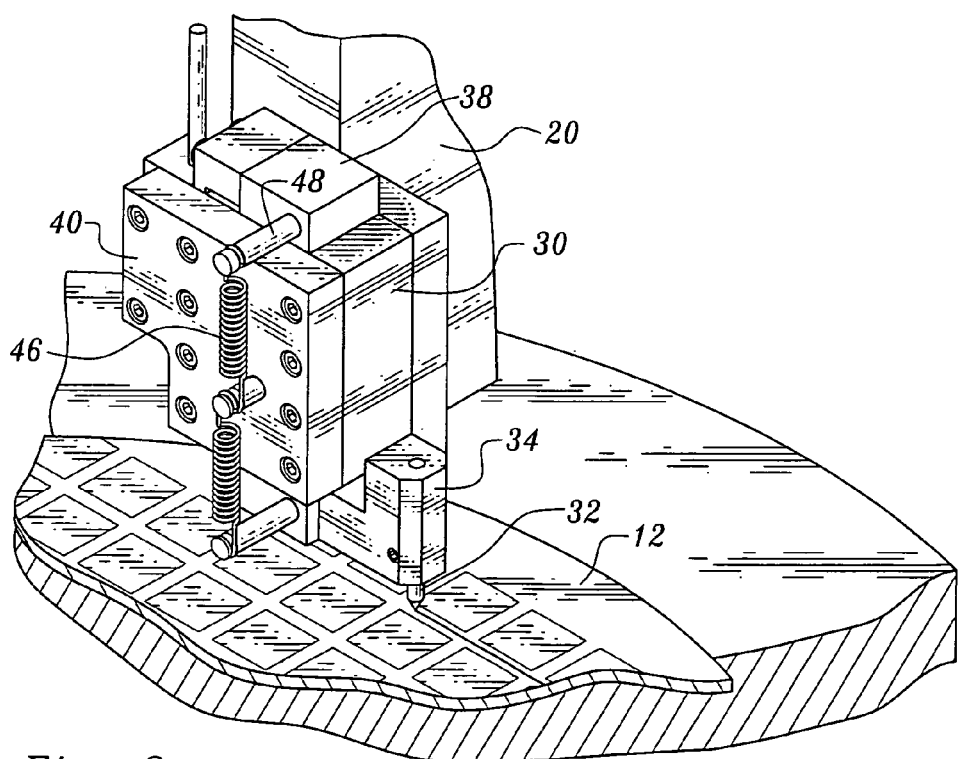
FIG. 2 is a greatly enlarged, perspective view of selected structural components of the apparatus when utilized to scribe a semiconductor wafer.
Figure 3:
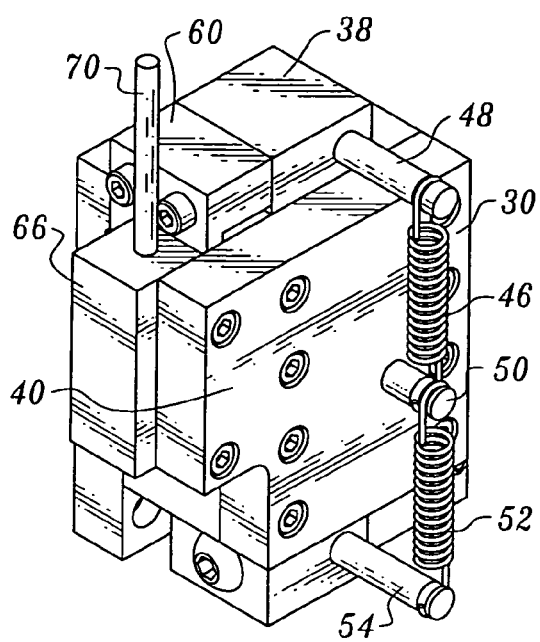
FIG. 3 is a perspective view illustrating scribe tool support structure including an air bearing shaft and air bearing housing slidably accommodating the air bearing shaft and springs maintaining the air bearing shaft and air bearing housing at an equilibrium condition wherein the shaft and housing are maintained at a predetermined relative position.
Figure 4:
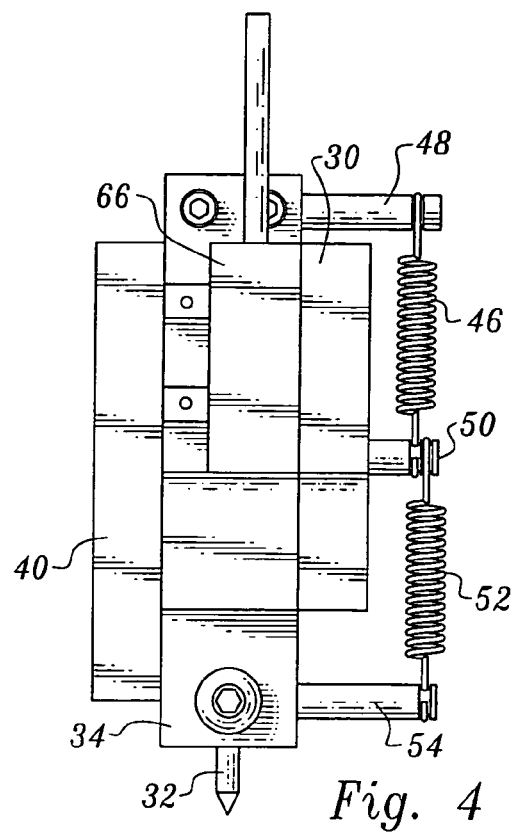
FIG. 4 is a front, elevational view of the structural components shown in FIG. 3 with the structural elements thereof in the condition of FIG. 3.
Figure 5:
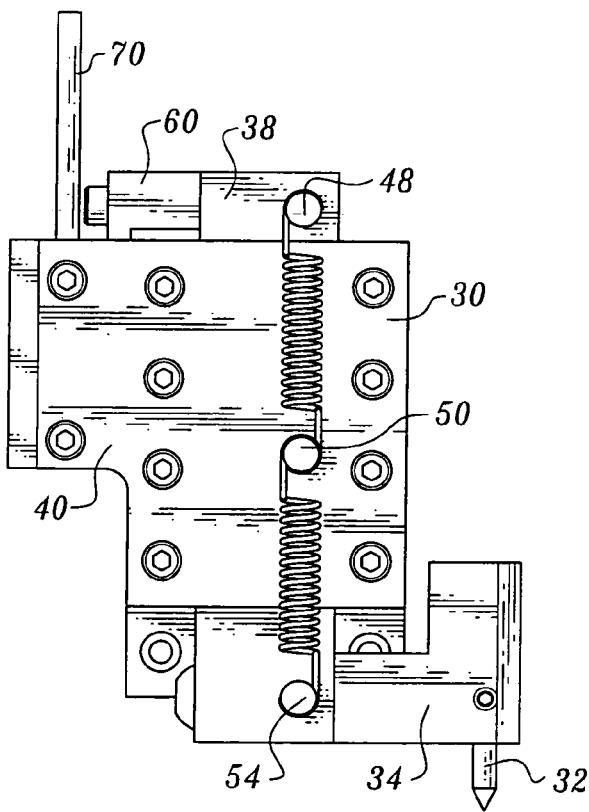
FIG. 5 is a side, elevational view of the scribe tool support structure shown in FIGS. 3 and 4 with structural elements thereof in the condition of FIGS. 3 and 4.
Figure 6:
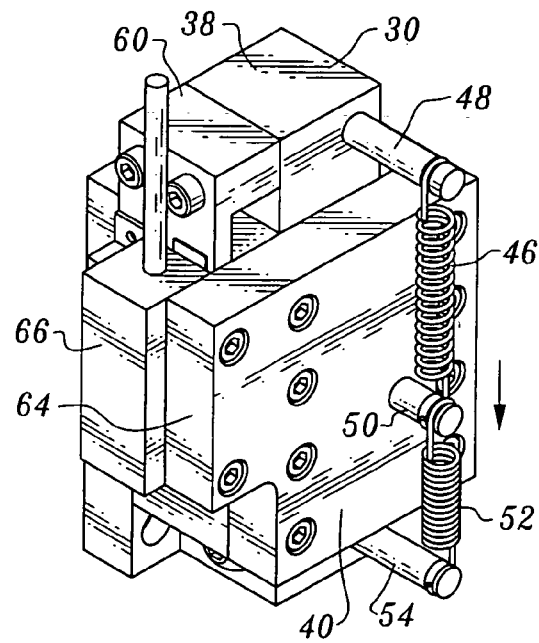
FIG. 6 is a view similar to FIG. 3, but illustrating the air bearing housing displaced downwardly relative to the air bearing shaft as indicated by the arrow.
Figure 7:
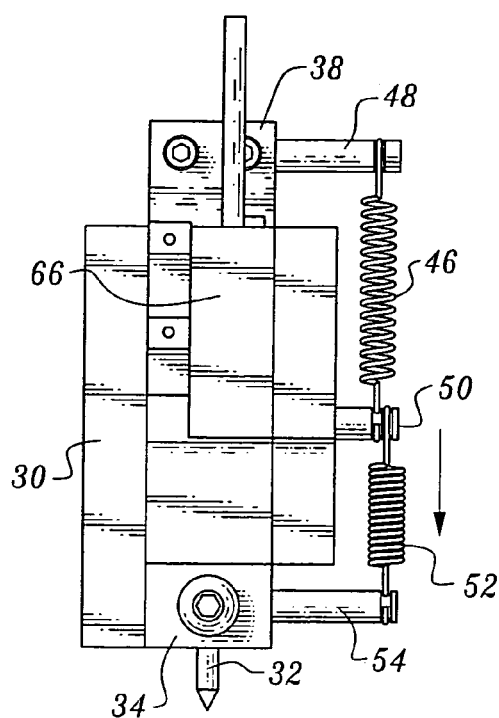
FIG. 7 is a view similar to FIG. 4, but illustrating the relative positions of the air bearing shaft and air bearing housing as shown in FIG. 6.
Figure 8:
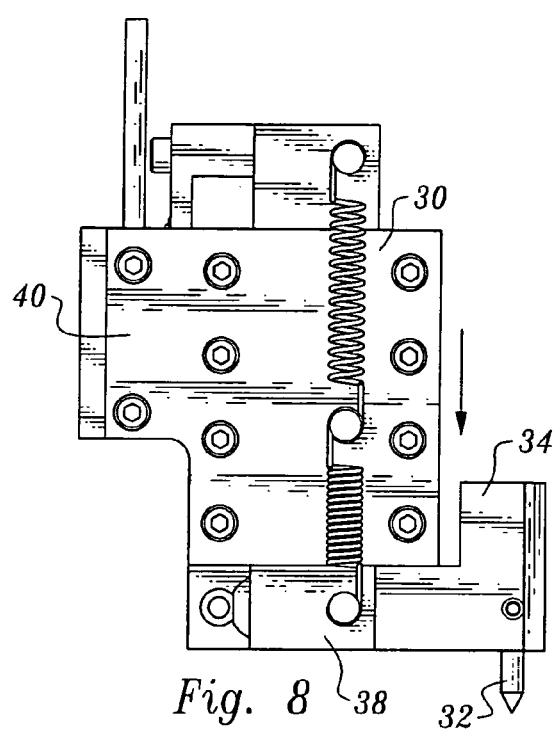
FIG. 8 is a view similar to FIG. 5, but illustrating the air bearing shaft and air bearing housing in the relative positions shown in FIGS. 6 and 7.
Figure 9:
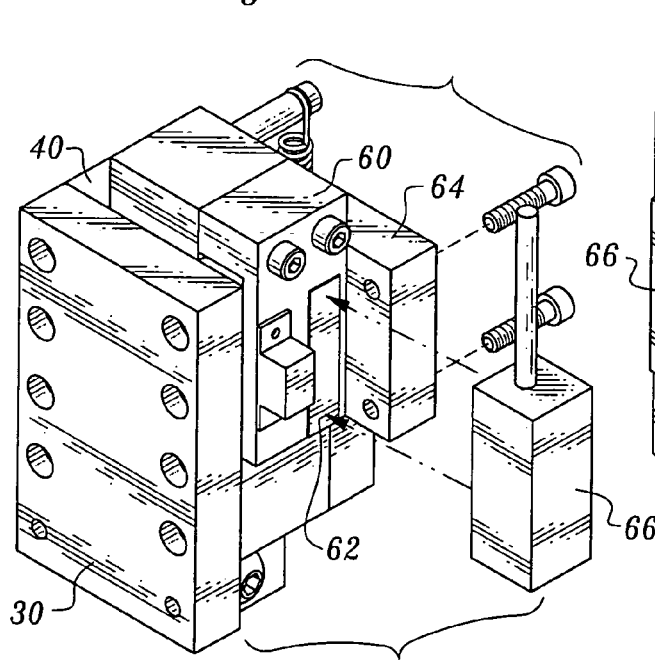
FIG. 9 is an exploded view of selected components of the apparatus.
Figure 10:
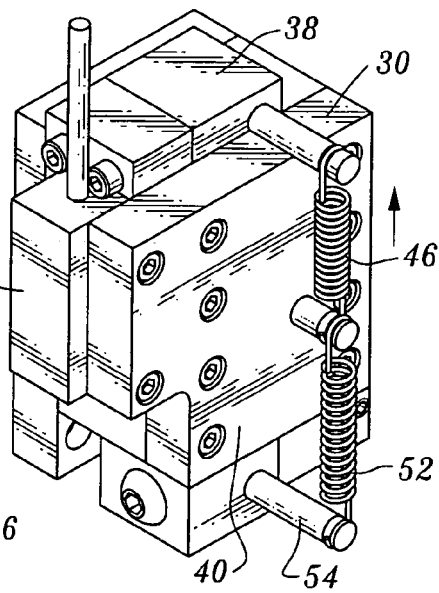
FIG. 10 is a view similar to FIGS. 3 and 6, but illustrating the air bearing housing displaced upwardly as shown by the arrow relative to the air bearing shaft.

FIGS. 1–11 illustrate apparatus constructed in accordance with the teachings of the present invention. The disclosed embodiment of the apparatus includes a wafer support in the form of a porous ceramic vacuum chuck 10 mounted on top of the rotary stage of the apparatus. The semiconductor wafer 12 to be scribed is placed on the vacuum chuck. Such an arrangement is disclosed in U.S. Pat. No. 6,826,840. The apparatus also incorporates a gantry transport system of the type disclosed in U.S. Pat. No. 6,826,840, the gantry being designated by reference numeral 16. The gantry consists of three precision linear stages. Each of the two side stages of the gantry are comprised of a high precision bearing, a linear motor, and a high precision linear encoder. The cross stage of the gantry is comprised of a high precision air bearing, a linear motor, and a high precision linear encoder.

A precision linear vertical stage 18 is mounted on the bearing block of the gantry cross stage bearing, all as described in U.S. Pat. No. 6,826,840. The vertical stage is comprised of a high precision air bearing including shaft 20, a linear motor 22 and a high precision linear encoder (not shown). In the preferred embodiment of the invention, the precision bearing is an air bearing. The linear motor 22 may be a U-channel style of linear motor, a thrust tube style of linear motor, or a piezoelectric linear motor. The vertical stage is mounted differently than the other linear stages of the gantry. The bearing block of the vertical stage is rigidly mounted to the bearing block of the cross stage while the vertical stage air bearing shaft 20 is allowed to move.

Disposed at the lower end of shaft 20, is a scribe tool support 30 supporting a scribe tool 32. The scribe tool is held by a tool holder 34 which is attached to the lower end of a very small air bearing shaft 38. The air bearing shaft 38 comprises a first structural component of the scribe tool support of the invention and the air bearing shaft 38 is slidably accommodated within an air bearing housing 40 comprising a second structural component of the scribe tool support structure. The scribe tool support structure is supported and transported by the movable transport structure of the apparatus including the vertical linear stage 18 of the gantry 16.

The air bearing shaft 38 slides vertically in the air bearing housing 40, but is prevented from moving in either of the two lateral directions due to the air pressure between the sides of the air bearing shaft and the inside walls of the air bearing housing.

One end of a coil tension spring 46 is attached to a post 48 near the top of the air bearing shaft and the other end thereof is attached to a post 50 near the center of the air bearing block. One end of another spring, lower coil tensioned spring 52, is attached to a post 54 near the bottom of the air bearing shaft and the other end of spring 52 is attached to post 50 near the center of the air bearing housing or block.

The springs 46, 52 are in alignment and mounted so that they are in continuous tension. The springs continuously exert opposed pulling forces on the air bearing shaft, normally positioning the air bearing shaft in the position shown in FIGS. 3, 4 and 5 of the drawings. The air bearing shaft, in other words, is normally suspended in a neutral, predetermined position due to the action of the springs.

As the air bearing shaft 38 moves up or down, one of the two springs produces a force opposing movement of the air bearing shaft.

An encoder scale bracket 60 is mounted to the top of the air bearing shaft and extends downwardly along the outside of the air bearing block. An encoder scale 62 (see FIG. 9) is mounted on the encoder scale bracket facing in an outward direction. Located on a rigid mount 64 and attached thereto by mechanical fasteners, is a precision linear encoder 66, the encoder being in position to view the encoder scale.

The vertical linear stage 18 of the gantry 16 is operatively associated with the scribe tool support structure and the scribe tool supported thereby to selectively alternatively transport the tool support structure and the scribe tool supported thereby toward or away from the wafer support and the semiconductor wafer supported thereon. In addition, the vertical stage operates to control the force that the scribe tool, typically a diamond scribe tool, applies to the wafer.

When the diamond scribe tool is pressed into the surface of the wafer, the lower spring 52 will stretch and the scribe tool 32, the tool holder 34, the air bearing shaft 38, the encoder scale bracket 60 and the encoder scale 62 will move upward in direct proportion to the force applied by the scribe tool to the wafer surface.

This movement is measured by the encoder 66 reading the encoder scale. If the force is smaller than desired, the linear motor 22 of the transport system vertical stage is used to move the vertical stage air bearing shaft 20 down, thus deflecting the lower spring 52 by a greater amount and applying a greater force by the scribe tool to the surface of the wafer. If the force is larger than desired, the linear motor 22 of the transport system vertical stage is used to move the vertical stage air bearing shaft up, thus deflecting the lower spring by a lesser amount so that the scribe tool applies a smaller force to the surface of the wafer.

Figure 11:
FIG. 11 is a diagrammatic representation of a control system utilized in the apparatus.

The control of the force is automated by feeding the output from the encoder via an electrical conduit 70 into a computer (see FIG. 11). The computer is suitably programmed to determine the difference between the desired predetermined force and the force measured by the force sensor structure described above. The computer then sends an appropriate signal to the linear motor 22 of the system's vertical stage 18 to cause the air bearing shaft 20 to move up or down to provide the correct force.

In a system constructed in accordance with the teachings of the present invention, the air bearing shaft was 0.75 inches by 0.75 inches by 3.125 inches. The encoder 66 employed in the force sensor had a resolution of 0.1 micron and was manufactured by Renishaw, Inc. The springs 46, 52 were ultra precision extension springs, the springs being 0.180 inches in diameter by 0.75 inches long. The wire employed in the springs was 0.022 inches in diameter. Using the springs, the force sensor had an output of 67 encoder counts per gram of force. Of course, the specifications indicated are merely representative and by way of example.

The force sensing apparatus described above will also function in substantially the same manner if the force sensor air bearing shaft 38 is part of or is attached to the vertical air bearing shaft 20 and the scribe tool holder 34 is attached to the force sensor air bearing housing 40.

The invention claimed is:

1. Apparatus for scribing a semiconductor wafer while controlling scribing forces, said apparatus comprising, in combination:
   a wafer support for supporting a semiconductor wafer;
   a scribe tool;
   scribe tool support structure supporting said scribe tool;
   movable transport structure including a linear vertical stage having a vertically movable member, said scribe tool support structure connected to said vertically movable member and supported thereby, vertical movement of said vertically movable member operable to selectively alternatively move said tool support structure and the scribe tool supported thereby toward or away from said wafer support and a semiconductor wafer supported thereon, said scribe tool support structure including relatively slidably movable first and second structural components, said scribe tool being attached to said first structural component and said second structural component affixed to said vertically movable member, said scribe tool being movable with said first structural component relative to said second structural component responsive to force exerted by said scribe tool on the semiconductor wafer after engagement therebetween, and the vertically movable member of said transport structure movable toward said semiconductor wafer when said force is less than a predetermined force and movable away from said semiconductor wafer when said force is greater than said predetermined force; and
   biasing structure operatively associated with said first structural component continuously exerting opposed biasing forces on said first structural component to resist relative slidable movement between said first structural component and said second structural component to continuously urge said first structural component to a predetermined position relative to said vertically movable member and said second structural component.

2. The apparatus according to claim 1 additionally comprising an encoder connected to said second structural component for sensing the displacement of said first component and said scribe tool relative to said second structural component and said vertically movable member, a computer receiving signals from said encoder, and a motor for moving said vertically movable member alternatively toward or away from said semiconductor wafer controlled by signals from said computer.

3. The apparatus according to claim 1 wherein said motor is a linear motor.

4. The apparatus according to claim 2 wherein said first structural component includes an air bearing shaft and wherein said second structural component comprises an air bearing housing slidably accommodating said air bearing shaft.

5. The apparatus according to claim 4 additionally comprising an encoder scale movable with said air bearing shaft, said encoder comprising a linear encoder located adjacent to said encoder scale.

6. The apparatus according to claim 4 wherein said biasing structure comprises springs under tension connected to said air bearing shaft at spaced locations on said air bearing shaft and exerting opposed pulling forces on said air bearing shaft, said air bearing shaft being at said predetermined position when said opposed pulling forces are equal.

7. The apparatus according to claim 6 wherein said springs are mounted on said air bearing housing, at least one of said springs having an end connected to said air bearing shaft above said air bearing housing and at least one other of said springs having an end connected to said air bearing shaft below said air bearing housing.

8. The apparatus according to claim 7 wherein said springs comprise at least two coil springs disposed in substantial alignment.

9. A method of scribing a semiconductor wafer while controlling scribing forces, said method comprising the steps of:
   supporting a semiconductor wafer on a wafer support;
   utilizing scribe tool support structure having relatively slidably movable first and second structural components to support a scribe tool attached to said first structural component over said semiconductor wafer;
   employing a vertically movable member of a linear vertical stage to which said scribe tool support structure is connected to support and move said scribe tool support structure and said scribe tool toward said semiconductor wafer to bring said scribe tool into engagement with said semiconductor wafer;
   after the step of bringing said scribe tool into engagement with said semiconductor wafer by moving said vertically movable member, using said vertically movable member to cause said scribe tool to exert a force on said semiconductor wafer and cause relative slidable movement between said first and second structural components while maintaining said second structural component fixed against movement relative to said vertically movable member;
   moving said vertically movable member and said second structural component toward said semiconductor wafer when said force is less than a predetermined force;
   moving said vertically movable member and the second structural component away from said semiconductor wafer when said force is greater than said predetermined force; and
   continuously exerting opposed biasing forces on said first structural component to resist relative movement between said first structural component and said second structural component to continuously urge said first structural component to a predetermined position relative to said vertically movable member and said second structural component.

10. The method according to claim 9 including the steps of utilizing an encoder connected to said second structural component to sense the displacement of said first structural component and said vertically movable member, sending signals from said encoder to a computer and controlling a motor with said computer, responsive to receipt of said signals to move said transport structure alternatively toward or away from said semiconductor wafer.

11. The method according to claim 10 wherein said first structural component includes an air bearing shaft movable along with an encoder scale and wherein said second structural component comprises an air bearing housing, said step of sensing displacement comprising utilizing a linear encoder adjacent to said encoder scale to read said encoder scale.

12. The method according to claim 9 wherein said step of continuously urging said first structural component to a predetermined position relative to said vertically movable member and said second structural component comprises connecting springs under continuous tension to said first structural component at spaced locations thereon and employing said tensioned springs to exert continuous opposed pulling forces on said first structural component.

* * * * *